United States Patent [19]
Garcia

[11] Patent Number: 5,536,138
[45] Date of Patent: Jul. 16, 1996

[54] TERMINATION PRESS PIN

[75] Inventor: Douglas J. Garcia, Valley Center, Calif.

[73] Assignee: Electro Scientific Industries, Inc., Portland, Oreg.

[21] Appl. No.: 329,694

[22] Filed: Oct. 26, 1994

Related U.S. Application Data

[63] Continuation of Ser. No. 947,492, Sep. 18, 1992, abandoned.

[51] Int. Cl.⁶ .............................. B23P 19/00; B65G 59/00
[52] U.S. Cl. ........................... 414/799; 414/417; 29/707; 29/757; 221/267
[58] Field of Search ........................... 29/740, 707, 749, 29/757; 414/417, 799; 221/243, 267

[56] References Cited

U.S. PATENT DOCUMENTS

| | | | |
|---|---|---|---|
| 1,264,963 | 5/1918 | Myers | 221/267 |
| 1,919,060 | 7/1933 | Harder | 221/267 |
| 2,686,356 | 8/1954 | Wolosianski | 29/707 |
| 4,102,043 | 7/1978 | Andrade et al. | 29/757 |
| 4,127,432 | 11/1978 | Kuwano et al. | 29/757 |
| 4,247,241 | 1/1981 | Warren | 414/417 |
| 4,381,321 | 4/1983 | Braden | 427/79 |
| 4,389,272 | 6/1983 | Ferri et al. | 29/740 |
| 4,395,184 | 7/1983 | Braden | 414/414 |
| 4,462,737 | 7/1984 | Bouwknegt | 29/740 |
| 4,526,129 | 7/1985 | Braden | 118/503 |
| 4,769,905 | 9/1988 | Korsunsky et al. | 29/842 |
| 4,847,991 | 7/1989 | Higuchi | 29/759 |
| 4,899,440 | 2/1990 | Pomatto et al. | 29/707 |
| 4,903,393 | 2/1990 | Higuchi | 29/450 |

FOREIGN PATENT DOCUMENTS 596408   3/1978   U.S.S.R. .

*Primary Examiner*—Karen B. Merritt
*Assistant Examiner*—Gregory A. Morse
*Attorney, Agent, or Firm*—Stoel Rives

[57] ABSTRACT

A device has a plurality of push pins for inserting workpieces into a device for securely retaining the workpieces. The push pins are resiliently biased to prevent damage to the components or the pins themselves. The pins may be mounted by springs which are stressed to a predetermined force, and the displacement of the pins may be sensed by mechanical or optical sensors. Alternatively, the pins themselves may be compressible to prevent damage to the device.

29 Claims, 5 Drawing Sheets

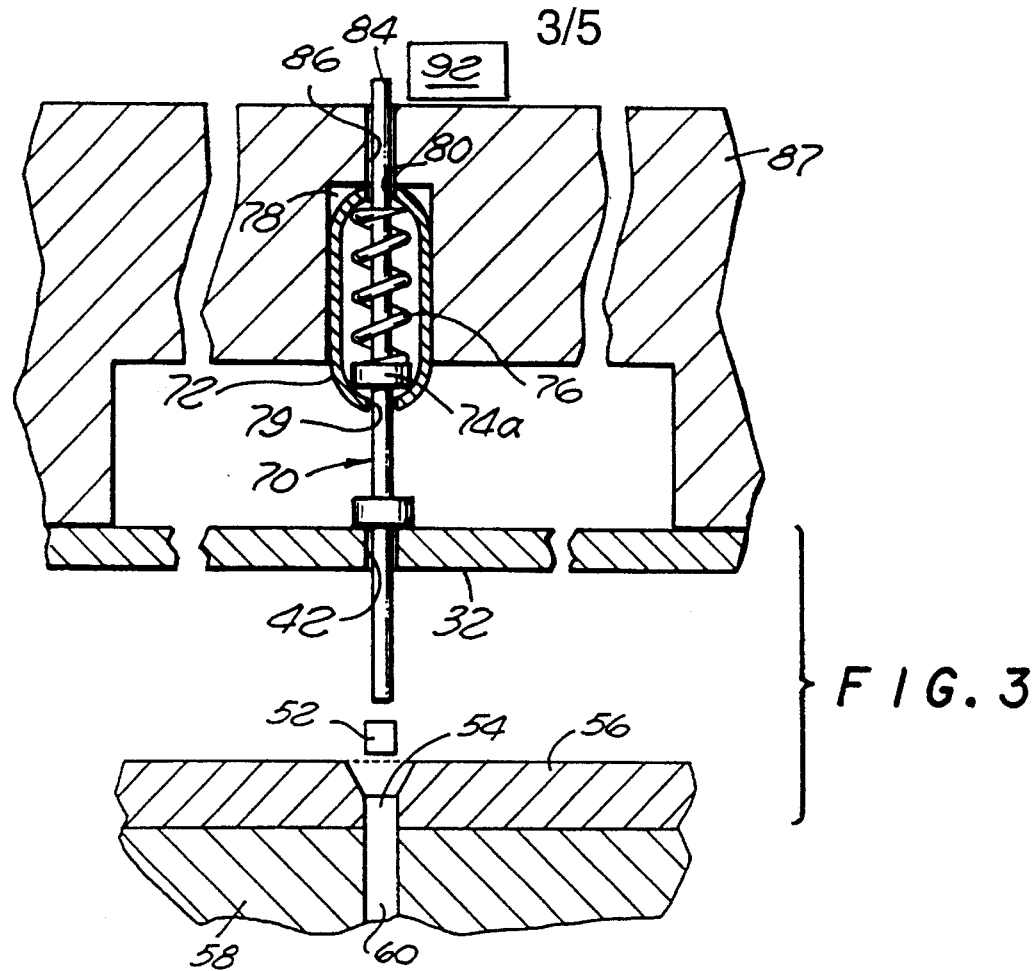
FIG. 3
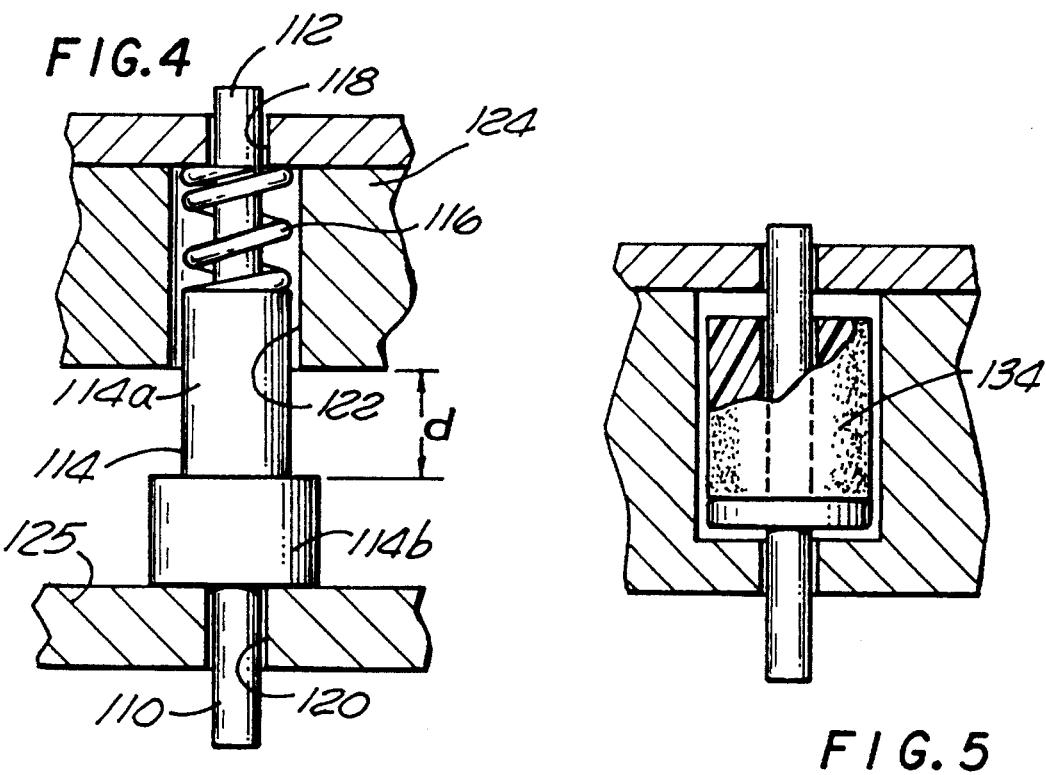
FIG. 4
FIG. 5

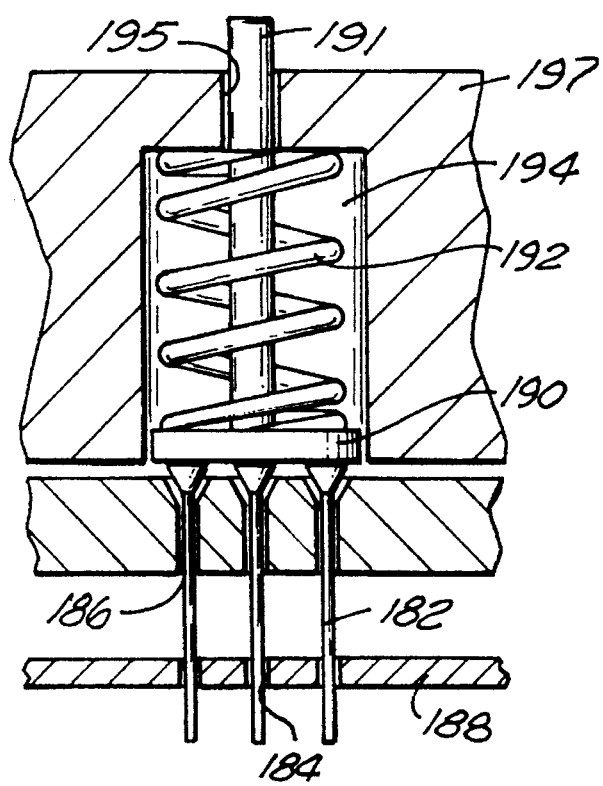
FIG. 8a
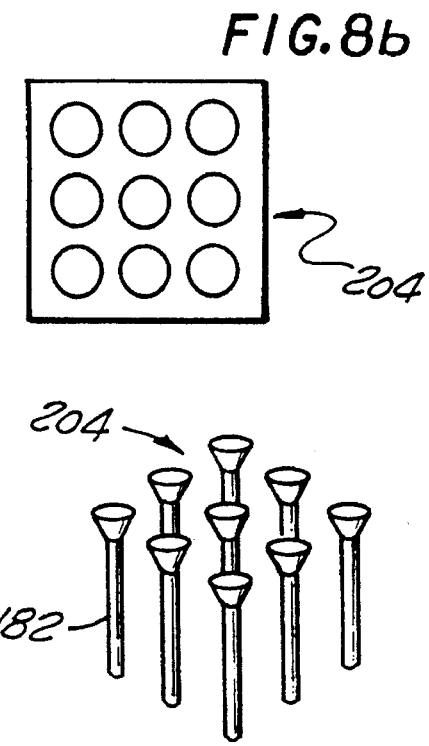
FIG. 8b
FIG. 8c
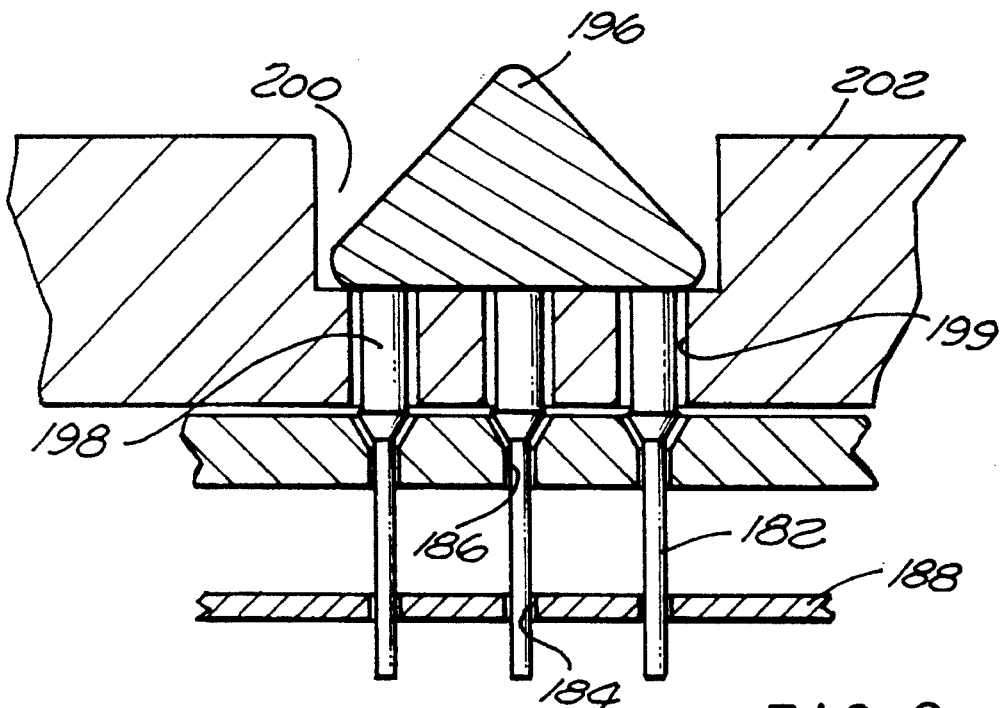
FIG. 8d

TERMINATION PRESS PIN

This application is a continuation of Ser. No. 07/947,492, filed Sep. 18, 1992, now abandoned.

FIELD OF THE INVENTION

The present invention relates generally to insertion pins which are used in a mechanical press to push objects into holding assemblies for transport, storage, or processing. It relates especially to such devices as used in connection with very small objects, such as miniature ceramic electronic devices or components.

BACKGROUND OF THE INVENTION

Due to their small size, density, and fragile structure, miniature electronic components (such as ceramic capacitors and resistors) require special devices systems, and methods for their transportation, handling and processing. These components are generally square or rectangular in shape and are typically loaded into a part-handling plate, or carrier plate, for handling and processing as a batch. Conventional carrier plates are described in U.S. Pat. Nos. 4,526,129; 4,381,321; 4,395,184; and 4,393,808. These plates are typically rectangular and have an array of apertures for resiliently holding miniature components. These apertures often have a circular or elliptical cross section which is lined with a pliable elastic material such as silicon rubber or a resilient polymeric material. The apertures through the pliable material have slightly smaller dimensions than the electronic components such that the material grips the components continuously as they are loaded into the aperture. The depth of each resilient aperture is typically greater than the maximum length of the part to be inserted. Once inserted, the component is held in place inside the carrier plate aperture by the resilient material, thus allowing for further transport, storage, or processing. Generally each carrier plate has an array of uniformly sized holding apertures.

Conventional component insertion techniques are described in U.S. Pat. Nos. 4,669,410, 4,395,184, 4,393,808, 4,381,321, and 4,526,129. According to these patents, vacuum suction is used in conjunction with mechanical vibration to load components into an array of funnel shaped guide openings in a loading plate. The loading plate openings abut and are aligned with the pliable apertures of the carrier plate. Loading or holding plates of various configurations are described for example in U.S. Pat. Nos. 4,903,393 and 4,847,991. A bank of pins rigidly held in a mechanical press are used to push the components through the loading plate guide openings and into the aperture of the carrier plate. Once the components have been pushed into the carrier plate apertures, the press pins are extracted, leaving the components held in place by the elastic material of the carrier plate. Termination press pins and their mounting plates are described in U.S. Pat. Nos. 4,381,321, 4,903,393, and 4,395,184. Miniature electronic components are typically processed in large scale batch fashion. Any factors which slow down or halt operation will greatly reduce the component throughput of the entire process.

Problems occur with conventional press pin configurations when excessive resistance is encountered in inserting the components. Such resistance can result from incorrect matching of the pin array with the array of openings in the loading or carrier plates, from debris or additional components in the insertion aperture, or from incorrect positioning of the components. Similar problems occur when a single press plate is used to insert workpieces of varying sizes into a holder having a positive stop. When the larger workpieces reach the positive stop, they can be subject to crushing force as the press plate continues to push the smaller components to the positive stop.

Any of these phenomena may result in damage to the press pins, the load plate, the carrier plate, or the component itself. Also, if a damaged press pin goes undetected during processing, it becomes a source of further damage to other components or equipment. Because the typical press contains a large number of pins (often thousands of pins per plate) the potential for pin damage is great. Replacing damaged pins requires substantial processing downtime. To reduce this downtime, manufacturers maintain large inventories of spare press equipment, adding to processing costs.

The problems mentioned above could be solved in part by using pressure sensors to detect excess loading resistance to the action of the entire press plate. With this approach, however, the loading cycle for all positions would have to be halted to prevent damage to an obstructed pin. It would be highly desireable to have a means of detecting and preventing pin damage which would not require halting the entire pressing cycle. In addition, a method of simply and quickly detecting the location of obstructed aperture is also desirable. Such a system would increase processing throughput, reduce operating costs, extend the useful life of the equipment assemblies and facilitate the identification and repair of damaged pins in a press plate.

A first object of the present invention is to provide a method of protecting press pins from damage caused by excessive loading resistance. A second object of the present invention is to provide a method of protecting press pins such that the pressing operation need not halt for all positions. A third object of the present invention is to provide a method of easily detecting obstructed or improperly aligned component loading apertures. Other and further objects of the invention will be apparent in light of the following disclosures.

SUMMARY OF THE INVENTION

Termination press pin plates of the present invention have an array of elongated pins mounted into a rigid press plate frame with a substantial portion of the pin shaft extending below the bottom surface of the press plate. The portion of the shaft which extends below the bottom of the press plate is used to engage the component and to load it into the holding assembly. The pins are mounted in such a manner that if the entire housing is pushed downward in the direction of the exposed pin shafts and perpendicular to the plane of the bottom surface of the press plate, and if a given pin shaft encounters a restrictive force greater than or equal to a predetermined safe resistance, that pin shaft will be allowed to travel upward vertically through the plate frame. This escape release feature thus has the effect of a vertical "clutch," preventing damage to the pins, the loading plates, and the components whenever the pin shaft encounters excessive resistance.

The press pins themselves may be arranged in any number of bank array configurations so long as the pin shafts are parallel to one another, perpendicular to the press plate top and bottom surfaces, and aligned colinearly with the component loading holes in the loading plate.

Since the pins must press down with sufficient force to push the components through the loading plate and into the carrier plate, the pins must not move upward until the resistance exceeds that of normal loading. In the present invention, a resistance mechanism (such as a spring) which is associated with each pin provides the appropriate resistance threshold. When the force against a pin becomes excessive, the spring compresses, allowing the pin shaft to travel upward through the plate frame. Once the press plate is disengaged, the spring restores itself, and the pin shaft returns to normal position. Thus, the pin mechanism allows the pressing cycle to continue without pin damage.

Alternative embodiments of the present invention can use sliding counter-weight masses instead of springs. Also, the spring can be replaced with suitable elastomeric material. In addition, spring or counter-weight mechanisms can be aligned to protect an array of pins rather than discrete individual pins. Furthermore, the pins themselves can be comprised of compressible elastomeric material.

Press pins of the present invention can also have a shaft extension which projects above the upper surface of the press plate when the pin shaft is forced upward. This extension facilitates electronic, mechanical, or optical sensing of obstructed pins or improperly aligned loading sites.

BRIEF DESCRIPTION OF THE DRAWINGS

FIG. 3 is an enlarged sectional view of an alternative embodiment of the present invention in which the release spring is constrained within a housing independent of the plate frame;

FIG. 4 is an enlarged sectional view of an alternative embodiment using a solid pin shaft of different widths;

FIG. 5 is an enlarged sectional view of an alternative embodiment in which the spring is replaced by a collar of elastic material;

FIG. 8a is a fragmentary sectional view of an alternative embodiment in which a single spring resistance assembly is applied across several pins;

FIGS. 8b and 8c are fragmenting section view of a variation of the embodiment of FIG. 8a wherein the spring is replaced by a solid weight;

FIG. 8d is a cross-sectional view of the embodiments of FIGS. 8b and 8c.

DETAILED DESCRIPTION OF THE INVENTION

Figure 1A:
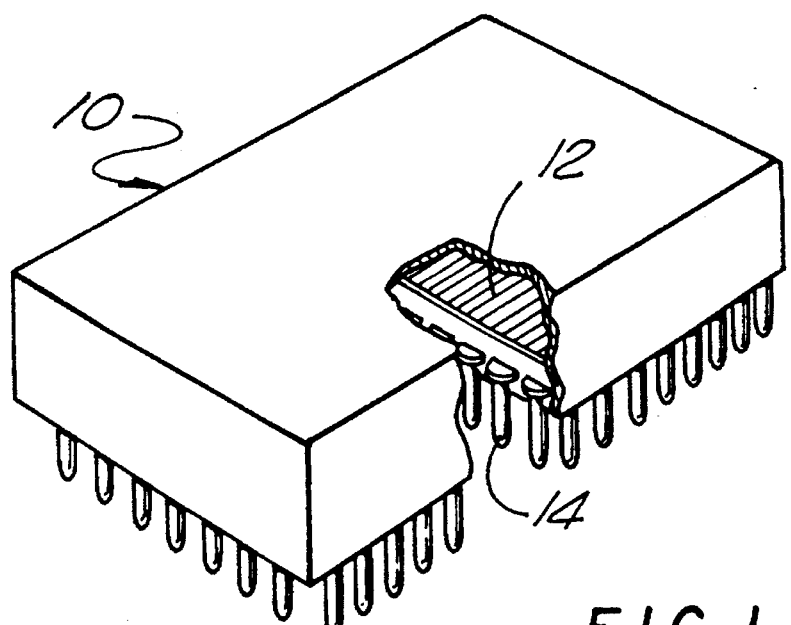
FIG. 1a is a plan, partly sectional view of a conventional press plate with rigidly held pins.
Figure 1B:
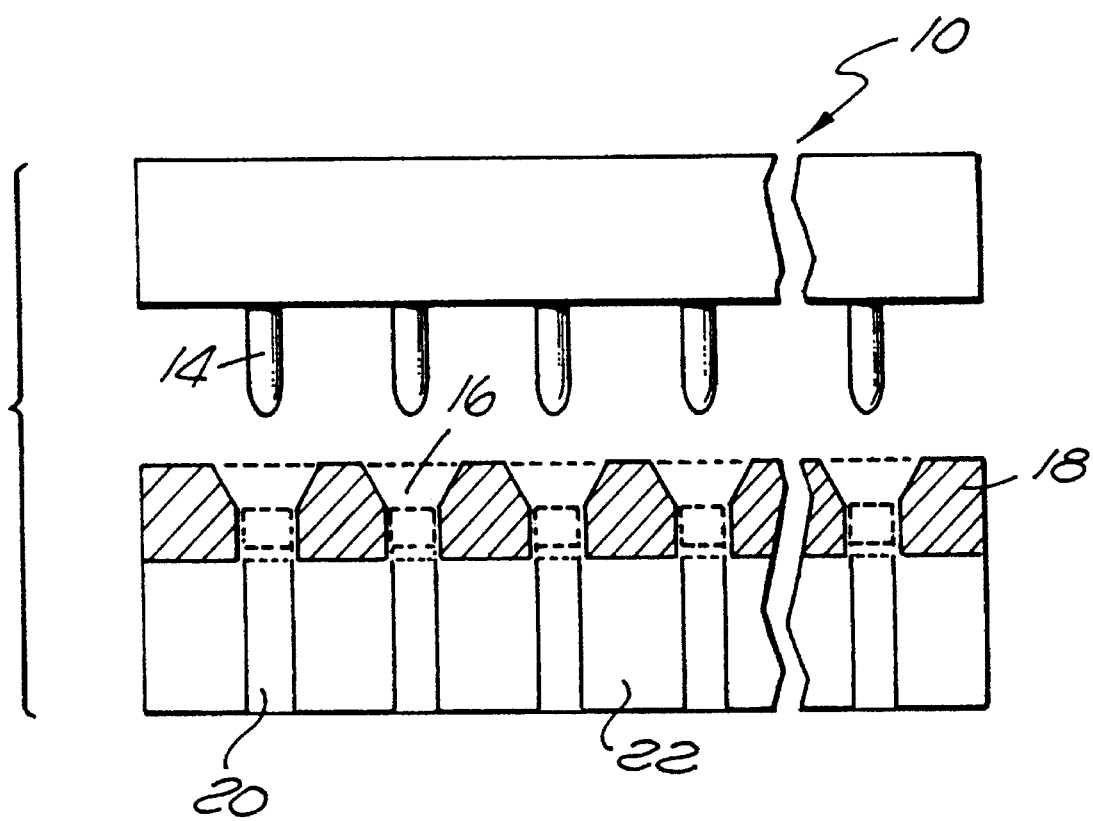
FIG. 1b is a sectional view of a conventional pin press, loading plate, and carrier plate assembly.
Figure 2:
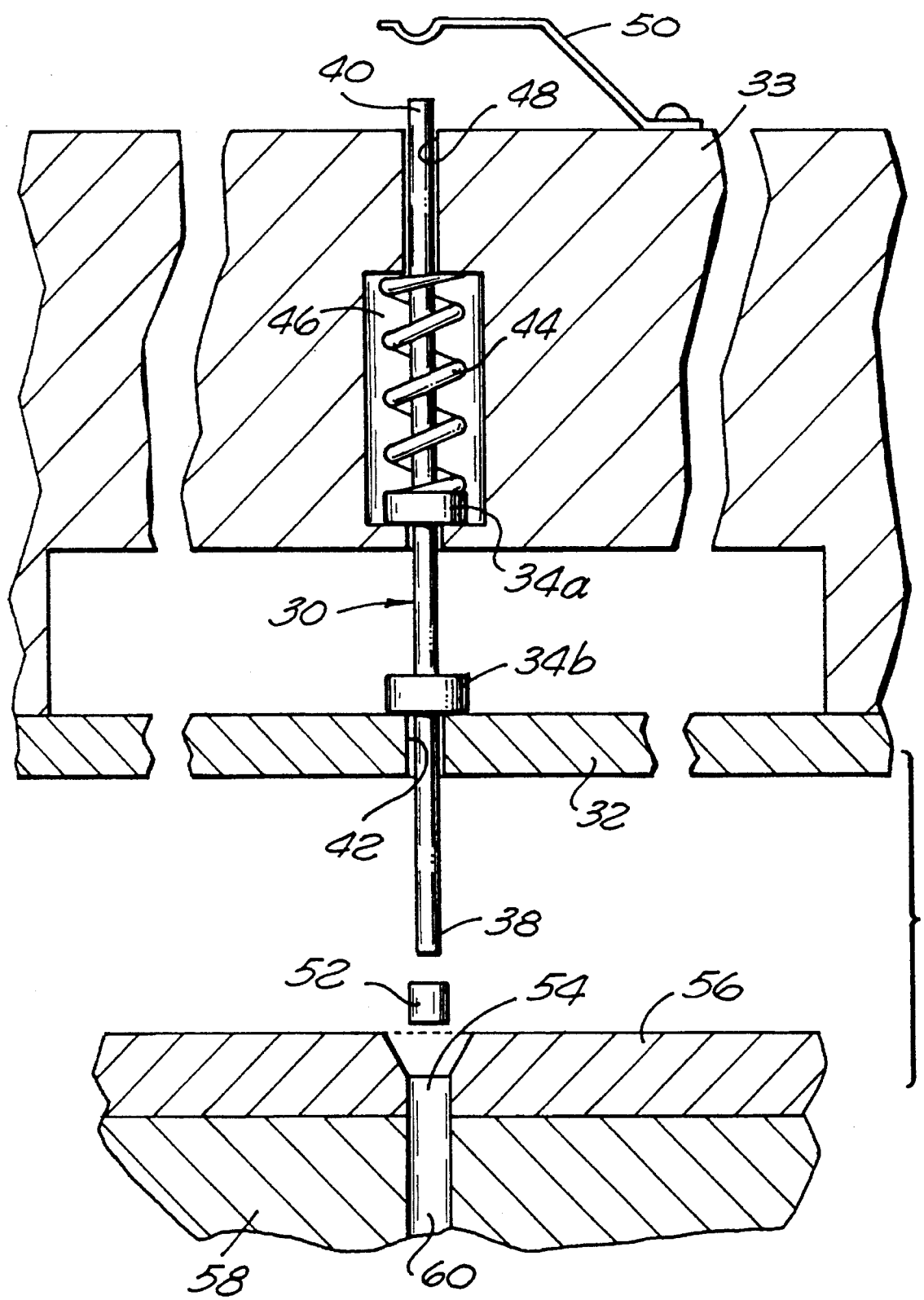
FIG. 2 is an enlarged sectional view of an embodiment of the present invention in which a press pin is protected by a spring release mechanism enclosed within the press plate frame.

FIG. 2 depicts a specific embodiment of the present invention. A rigid pin shaft 30 is enclosed within cavity 46 of press plate frame 33. Pin shaft 30 contains primary flange 34a and secondary flange 34b, which are spaced apart along the length of shaft 30. Upper section 40 of pin shaft 30 extends longitudinally from primary flange 34a through aperture 48 in press plate frame 33. The section of pin shaft 30 between flanges 34a and 34b passes through aperture 36 within press plate frame 33. The width of aperture 36 is less than that of flange 34a, but greater than the width of the center section of shaft 30. Thus, the downward travel of flange 34a and attached pin shaft 30 is constrained by aperture 36. Coil spring 44 encircles upper section 40 of pin shaft 30 above flange 34a and is located within cavity 46. Spring 44 is wider than aperture 48, but is less wide than flange 34a. Spring 44 is therefore constrained between aperture 48 and flange 34a. Stripper plate 32 lies vertically below and parallel to press plate frame 33 and is compressibly attached to plate 33. Aperture 42 passes through stripper plate 32. Flange 34b is attached to pin shaft 30 at a point below aperture 36 and above aperture 42. Flange 34b is wider than either aperture 36 or 42 and, therefore, its longitudinal travel is constrained between these apertures. Lower section 38 of pin shaft 30 extends below flange 34b and through aperture 42. In use, pin shaft 30 is aligned coaxially with component loading aperture 54 in loading plate 56 and component holding aperture 60 in carrier plate 58.

During a pressing cycle, press plate 33 and the assembly including spring 44, pin 30, and stripper plate 32 moves in the direction of loading plate 56. This motion causes lower extension 38 of pin shaft 30 to contact the upper surface of the miniature electronic component 52 placed in component loading aperture 54. As press plate 33 moves toward loading plate 56, pin 30 pushes component 52 through loading aperture 54 and into component holding aperture 60 of carrier plate 58. Spring 44 provides a compressive force equal to at least the normal component loading resistance for this application. If the resistance encountered in pushing component 52 into carrier plate 58 exceeds the force of spring 44, spring 44 compresses, allowing pin shaft 30 to travel upward toward press plate 33. This upward travel avoids damage to pin 30.

When pin shaft 30 travels toward plate 33, shaft Section 40 passes through aperture 48 and above the upper surface of plate 33. This may occur in response to, for example, an obstruction, a misaligned workpiece or a large workpiece reaching a positive stop. This allows mechanical or optical detection of the movement of pin 30. This movement may also be detected electrically by allowing extension 40 to contact an electrical sensor lead 50. An optical sensor is indicated in FIG. 3 at 92. Visual detection is also possible.

During component loading, stripper plate 32, aperture 42, and secondary flange 34b provide additional stability for pin shaft 30. The width tolerance of aperture 42 is such that shaft extension 38 passes through it without excessive friction, but aperture 42 constrains extension 38 against lateral wobble. Thus, when extension 38 of shaft 30 pushes component 52 toward loading plate 56, or when shaft 30 is forced toward plate 33 (as, for example, when obstructed), the motion of shaft 30 is almost completely along its longitudinal axis. In addition, flange 34b and aperture 36 limit the upward travel of shaft 30 toward plate 33. This travel limit ensures that the tip of extension 38 is never forced completely through aperture 42 to the opposite side of stripper plate 32.

In the alternative embodiment of FIG. 3, spring 76 is contained within a separate housing 72 independent of plate frame 87. Apertures 80 and 79 are at opposite ends of housing 72. Part of pin shaft 70 is enclosed within housing 72. Shaft extension 84 passes through housing aperture 80, extending into aperture 86 of plate frame 87. Primary shaft flange 74a is also enclosed within housing 72. Flange 74a is wider than housing aperture 79; thus, its downward vertical travel toward the direction of the loading plate is constrained at that point. Spring 76 encircles pin shaft 70 above flange 74a. The width of spring 76 is such that it is constrained between the top surface of flange 74a and aperture 80 of housing 72. Housing 72 may be removably seated within cavity 78 of plate frame 87, or it may be permanently installed.

When excessive component loading resistance is encountered, pin shaft 70 moves upward against the compressive force of spring 76 and toward press plate 87. The embodiment of FIG. 3 allows for simple replacement of the spring pins assemblies when necessary. Pin 70, spring 76, and housing 72 may be removed as a unit and a new assembly inserted.

The alternate embodiment shown in FIG. 4 incorporates pin shaft 114 having connected primary and secondary flanges 114a and 114b of different lengths and widths. Primary flange 114a has a greater longitudinal dimension than its width and is partially enclosed within cavity 122 of plate frame 124. The width of cavity 122 is such that primary flange 114a may slide within it without excessive friction, and with negligible lateral motion. Pin shaft section 112 extends from the upper surface of primary flange 114a through part of cavity 122, and finally through aperture 118 in plate frame 124.

Secondary flange 114b is wider than its longitudinal dimension and abuts one end of flange 114a on the side opposite stripper plate 125. Flange 114b is also wider than both aperture 120 of stripper plate 125 and cavity 122 of plate frame 124. Thus, the longitudinal motion of flange 114b is limited by these apertures. Pin shaft section 110 extends from below flange 114b and through aperture 120 of the stripper plate. Spring 116 encircles section 112 of pin 114 and is constrained within cavity 122 between aperture 118 and the upper surface of flange 114a. When excessive resistance is encountered during component loading, spring 116 compresses, allowing pin shaft 114 to travel upward through press plate 124.

FIG. 5 depicts an alternative embodiment of the present invention in which the spring which is used in the embodiments previously discussed is replaced with cylindrical collar 134 of solid compressible material, such as an elastomeric polymer, such as a silicone resin.

Figure 6A:
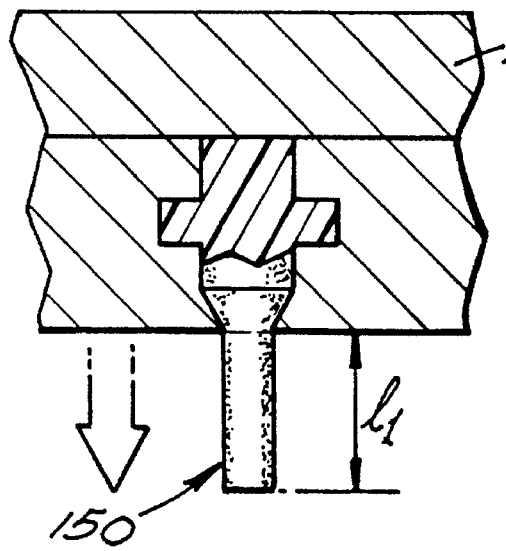
FIG. 6a is an enlarged sectional view of a pin composed of compressible material at normal loading length.
Figure 6B:
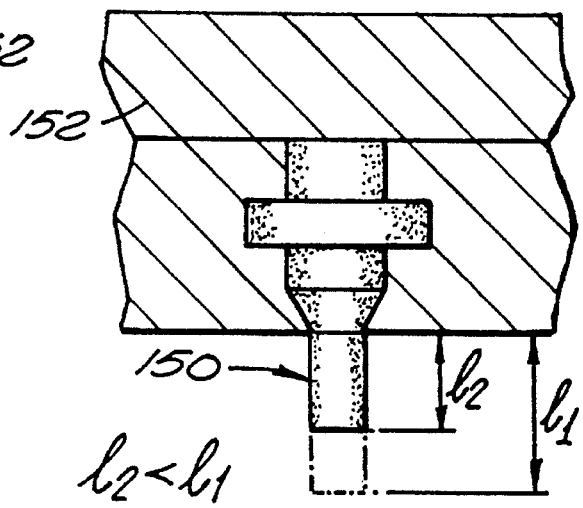
FIG. 6b is an enlarged sectional view of a compressible pin at its compressed length.

FIGS. 6a and 6b illustrate a further alternative embodiment of the present invention in which the pin shaft 150 in plate frame 152 is itself composed of a compressible material, such as an elastomeric polymer or an elongated spring. The material chosen for pin 150 must be able to withstand a force equal to the normal component loading resistance applied longitudinally at its tip with minimal compression. When a force greater than the normal loading resistance is encountered, the pin 150 compresses instead of breaking. FIG. 6b depicts pin 150 in the compressed state with the difference between lengths $l_1$ and $l_2$ representing the compression distance.

Figure 7:
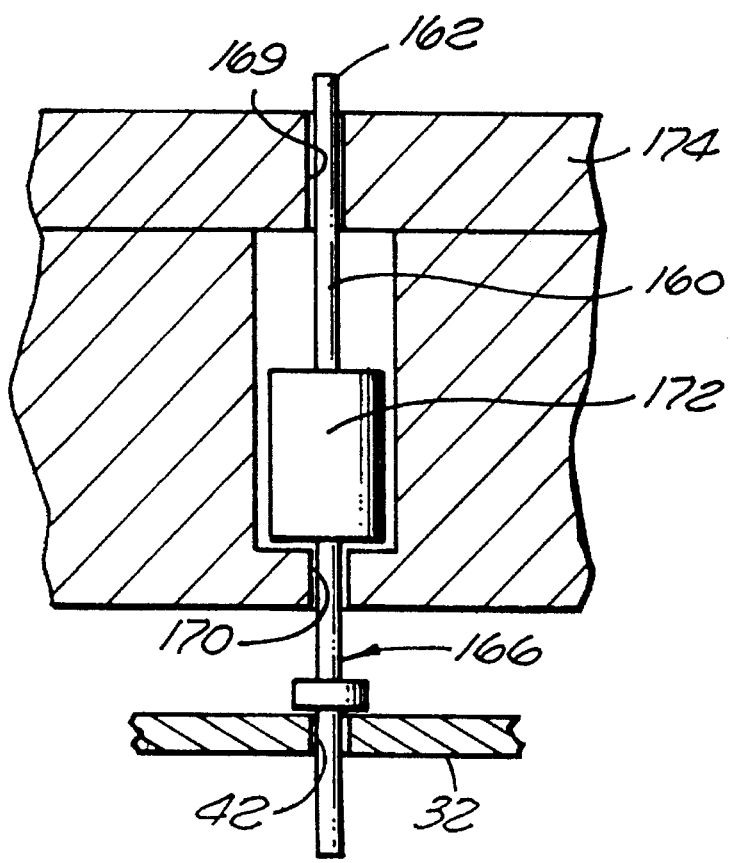
FIG. 7 is an enlarged sectional view of an alternative embodiment in which the press pin shaft is mounted to a solid resistive weight.

An alternative embodiment of the present invention uses a solid weight mounted over a vertically slidable pin. FIG. 7 depicts such an embodiment. Weight 172 is a solid mass firmly attached to the upper section of pin shaft 166. The width of weight mass 172 is greater than that of the pin shaft 166 and aperture openings 169 and 170 of cavity 160. Weight 172 is configured such that it may slide longitudinally within the cavity 160, its upward and downward motion constrained between apertures 169 and 170. The mass of weight mass 172 provides sufficient counter force to overcome the normal component loading resistance, but allows upper section 162 of pin shaft 166 to travel upward through plate 174 when potentially damaging resistance is encountered.

FIGS. 8a and 8b depict another embodiment of the present invention in which the spring or weight force is applied across an array of pins. In FIG. 8a, cavity 194 is embedded within plate frame 197 having at one end an upper exit aperture 195 and a plurality of lower exit apertures 186 at the other end. Apertures 186 are of a generally beveled shape, the upper openings facing cavity 194 being wider than the central channels and lower openings. Flathead pins 182 extend through aperture openings 186. The heads of pins 182 are also of a generally beveled shape matching that of the upper openings of apertures 186. Pins 182 fit within apertures 186 in a manner allowing them to slide upward longitudinally toward cavity 194. Since the heads of pins 182 are wider than the central channels of apertures 186, the downward travel of pins 182 is constrained. In normal position, the upper surfaces of pins 182 form a generally flat continuous planar surface at the bottom of cavity 194.

Plunger shaft 191 extends into exit aperture 195 at the top of cavity 194. At the base of plunger shaft 191 is flange 190 which has generally flat planar upper and lower surfaces, and rests at the bottom of cavity 194, abutting the top surfaces of pins 182. The width of flange 190 is such that its bottom surface completely covers the top surfaces of a plurality of pins 182. Nine pin array 204 is depicted in FIGS. 8b and 8c. Flange 190 is rigidly connected to plunger shaft 191. Plunger shaft 191 is also encircled by coil spring 192 within cavity 194. Spring 192 is wider than aperture opening 195 and is therefore constrained between the top surface of flange 190 and aperture 195. Spring 192 provides compressive resistance on each pin equivalent to the damage limited component loading force for nine pin array 204.

Pin shafts 182 extend longitudinally downward through aperture openings 184 in stripper plate 188. During a pressing cycle, the entire assembly containing plate frame 197, spring 192, flange 190, pins 182, and stripper plate 188 is moved downward in a direction parallel to the longitudinal axis of pins 182 and toward the loading plate. If a pin in pin array 204 encounters excessive resistance in its downward travel, spring 192 compresses, allowing the pin to travel upward. The presence of an obstruction may be detected by sensing either upward motion or tilt of plunger shaft 191.

This configuration exploits the large difference between the normal component loading resistance (60 to 200 grams) and the resistance at which pin damage occurs (often around 1000 grams). Thus, a spring tension may be selected which allows loading to continue if all of the pins in the array are unobstructed, but which permits pin release if the force on a given pin exceeds the damage tolerance.

Another version of the above embodiment is depicted in FIG. 8d. In this version, weight mass 196 having a generally pyramidal shape and a generally flat planar lower surface, is placed at the bottom of channel 200 on the surface of plate frame 202. Channel 200 contains a plurality of apertures 199 within which sliding rod elements 198 are housed. Rod elements 198 are of generally cylindrical or rectangular cross section with generally flat planar top and bottom surfaces. The bottom surfaces of rods 198 abut the top surfaces of pins 182 near the lower exit openings of apertures 199. The lower exit openings of apertures 199 are beveled to match the head shapes of pins 182 such that the downward travel of pins 182 and adjacent rods 198 is constrained.

The lengths of rods 198 are such that the flat top surfaces of rods 198 are flush with the upper openings of apertures 199, forming a generally flat continuous surface along the bottom of channel 200. The flat bottom surface of weight 196 rests on the bottom of channel 200, abutting the tops of a plurality of rods 198. In this example, weight 196 covers a 3×3 array of rods 198 aligned coaxially with nine pin array 204. The width of the heads of pins 182 in array 204 are such that the pins may slide upward through channels 199. The mass of weight 196 matches the damage limited component loading resistance for pins 182.

If one or more of the pins in array 204 encounters excessive resistance during a pressing cycle, that pin may move upward through channel 199, thus avoiding damage. The presence of the obstructed pin may be detected by sensing the upward travel or tilt of weight 196.

In view of this description of the present invention, it will be apparent to those skilled in the art that the invention may be practiced in a variety of ways in addition to the specific embodiments illustrated herein without departing from the scope of the invention.

I claim:

1. An apparatus for the insertion of a plurality of workpieces into a plurality of receptacles in a means for securely retaining the workpieces, comprising:

a rigid planar press plate having a first surface which, in use, is disposed towards the workpieces and the means for securely retaining the workpieces, and a second surface which, in use, is disposed away from the workpieces and the means for securely retaining the workpieces;

a plurality of cavities within the press plate, each cavity having openings through the first and second surfaces of the press plate;

a push pin located within each of the cavities and extending out of the press plate through each of the openings between the cavity and the first surface of the press plate, each push pin having a long axis which is substantially perpendicular to the plane of the press plate, and being capable of movement along its long axis in relation to the press plate;

motion restraining means within each of the cavities of the press plate which hold the push pins in an extended position from the cavities and which, upon application of a predetermined force along the along axis of the pin, in the direction of the plate, will allow the push pin to move along its long axis into the cavity within the push plate and to protrude through the opening in the second surface of the press plate; and means for detecting the protrusion of the push pin through the opening in the second surface of the press plate, wherein the push pins and cavities are arranged on the plate so that when the press plate is applied to the means for securely retaining the workpieces, each of the push pins will engage a workpiece and insert the workpiece into one of the receptacles in the means for securely retaining the workpieces, and wherein the predetermined force is a force in excess of the force required to engage the workpiece and insert the workpiece into the receptacle in the means for securely retaining the workpiece.

2. The apparatus of claim 1 wherein the motion restraining means is a spring.

3. The apparatus of claim 1 wherein the motion restraining means is an elastomeric material.

4. The apparatus of claim 3 wherein the elastomeric material is a silicone resin.

5. The apparatus of claim 1 wherein the motion restraining means is a compressible portion of the push pin.

6. The apparatus of claim 1 wherein the means for detecting the protrusion of the push pin is an optical sensor.

7. The apparatus of claim 1 wherein the means for detecting the protrusion of the push pin is an electric switch.

8. The apparatus of claim 1 wherein the predetermined force is greater than the force required to insert the workpiece and less than a force required to bend the push pins.

9. The apparatus of claim 1 wherein the push pin and motion restraining means are removably installed in the press plate.

10. The apparatus of claim 1 wherein the predetermined force is applied to the push pin due to an obstruction in the path of the workpiece to be inserted.

11. The apparatus of claim 1 wherein the predetermined force is applied to the push pin when the workpiece reaches a positive stop in the means for securely retaining the workpieces.

12. An apparatus for the insertion of a plurality of workpieces into a plurality of receptacles in a means for securely retaining the workpieces, comprising:

a rigid, planar press plate having:
   a first surface which, in use, is disposed towards the workpieces and the means for securely retaining the workpieces,
   a second surface which, in use, is disposed away from the workpieces and the means for securely retaining the workpieces,
   a plurality of means for holding push pins so that the long axis of each push pin is substantially perpendicular to the plane of the press plate, and a plurality of push pins, each of which:
   is held in one of the means for holding push pins,
   is capable of motion along its long axis within the means for holding push pins, and,
   in use, extends from the first surface of the press plate and is positioned on the press plate so as to engage a workpiece and insert the workpiece into one of the receptacles in the means for securely retaining the workpieces;

a plurality of motion restraining means located on the second surface of the press plate, each of which engages a plurality of push pins through openings in the second surface of the press plate, and which permits substantially no motion of the press pins engaged by the motion restraining means along their long axes unless a predetermined force is applied to one of the press pins engaged by the motion restraining means and thereby causes the motion restraining means to move in relation to the press plate, wherein the predetermined force is a force which is in excess of the force which is required for one of the press pins which are engaged by the motion restraining means to engage a workpiece and to insert the workpiece into the receptacle in the means for securely retaining the workpieces; and means for detecting motion of the motion restraining means.

13. The apparatus of claim 12 wherein at least one of the motion restraining means is a weight.

14. The apparatus of claim 12 wherein the means for detecting is an optical sensor.

15. The apparatus of claim 12 wherein the means for detecting is an electric switch.

16. The apparatus of claim 12 wherein the predetermined force is greater than the force required to insert the workpiece and less than a force required to bend the push pin.

17. The apparatus of claim 12 wherein the push pin and motion restraining means are removably installed in the press plate.

18. The apparatus of claim 12 wherein the predetermined force is applied to the push pin due to an obstruction in the path of the workpiece to be inserted.

19. The apparatus of claim 12 wherein the predetermined force is applied to the push pin when the workpiece reaches a positive stop in the means for securely retaining the workpieces.

20. An apparatus for the insertion of a plurality of workpieces into a plurality of receptacles in a means for securely retaining the workpieces, comprising:

a rigid, planar press plate having a first surface which, in use, is disposed towards the workpieces and the means for securely retaining the workpieces, and a second surface which, in use, is disposed away from the workpieces and the means for securely retaining the workpieces;

a plurality of push pins located in the press plate and extending from the first surface of the press plate, with the long axes of the push pins substantially perpendicular to the plane of the press plate, each of the push pins being capable of movement along its long axis;

a plurality of means for restraining the motion of the push pins along their long axes unless a predetermined force is applied to the pins, wherein the push pins are arranged on the press plate so that, in use, each of the push pins engages a workpiece and inserts the workpiece into one of the receptacles in the means for securely retaining the workpieces; and means for detecting the motion of at least one of the push pins in response to the predetermined force.

21. The apparatus of claim 20 wherein the motion restraining means is a spring.

22. The apparatus of claim 20 wherein the motion restraining means is an elastomeric material.

23. The apparatus of claim 22 wherein the elastomeric material is a silicone resin.

24. The apparatus of claim 20 wherein the motion restraining means is a compressible portion of the push pin.

25. The apparatus of claim 20 wherein the means for detecting the motion of the push pin is an optical sensor.

26. The apparatus of claim 20 wherein the means for detecting the motion of the push pin is an electric switch.

27. The apparatus of claim 20 wherein the predetermined force is greater than the force which is required to insert the workpiece and less than a force required to bend the push pin.

28. The apparatus of claim 20 wherein the predetermined force is applied to the push pin due to an obstruction in the path of the workpiece to be inserted.

29. The apparatus of claim 20 wherein the predetermined force is applied to the push pin when the workpiece reaches a positive stop in the means for securely retaining the workpieces.

* * * * *